United States Patent [19]

Moncorge

[11] Patent Number: 5,068,598
[45] Date of Patent: Nov. 26, 1991

[54] TENSION POTENTIAL MEASURING CIRCUIT WITH SELECTED TIME CONSTANT

[75] Inventor: Jean-Paul Moncorge, Vaux en Velin, France

[73] Assignee: GEC Alsthom SA, Paris, France

[21] Appl. No.: 620,798

[22] Filed: Dec. 3, 1990

[30] Foreign Application Priority Data

Dec. 7, 1989 [FR] France ............... 89 16189

[51] Int. Cl.$^5$ .......................... G01R 19/00
[52] U.S. Cl. ................ 324/107; 324/103 R; 324/111; 324/126
[58] Field of Search ........... 324/102, 103 R, 103 P, 324/111, 107, 126; 361/55, 56, 111; 364/483

[56] References Cited

U.S. PATENT DOCUMENTS

| | | | |
|---|---|---|---|
| 3,624,500 | 11/1971 | Patzelt | 324/111 |
| 3,665,506 | 5/1972 | Sanford | 324/111 |
| 3,732,492 | 5/1973 | Geul | 324/103 P |
| 4,327,390 | 4/1982 | Despiney | 324/126 |
| 4,556,842 | 12/1985 | Rosswurm | 324/103 P |
| 4,611,194 | 9/1986 | Konig et al. | 324/103 P |

FOREIGN PATENT DOCUMENTS 2162723 7/1972 Fed. Rep. of Germany.
2227420 1/1973 Fed. Rep. of Germany.
2365245 9/1977 France.

Primary Examiner—Kenneth A. Wieder
Assistant Examiner—William J. Burns
Attorney, Agent, or Firm—Sughrue, Mion, Zinn, Macpeak & Seas

[57] ABSTRACT

A circuit for measuring the tension of an electricity line, the circuit comprising a capacitive divider comprising first and second capacitors, first and second amplification lines for amplifying the tension across the terminals of the second capacitor, said amplification lines having respective time constants of the order of 100 ms and in the range 2.5 ms to 15 ms, the amplification lines being connected to respective first and second controlled switches under the control of a logic circuit, the circuit further including a circuit for generating the absolute value of the algebraic difference between the signals provided by the amplification lines, and a comparator circuit for providing an output signal that controls the logic circuit causing it to change state when said absolute value exceeds a given threshold.

5 Claims, 1 Drawing Sheet

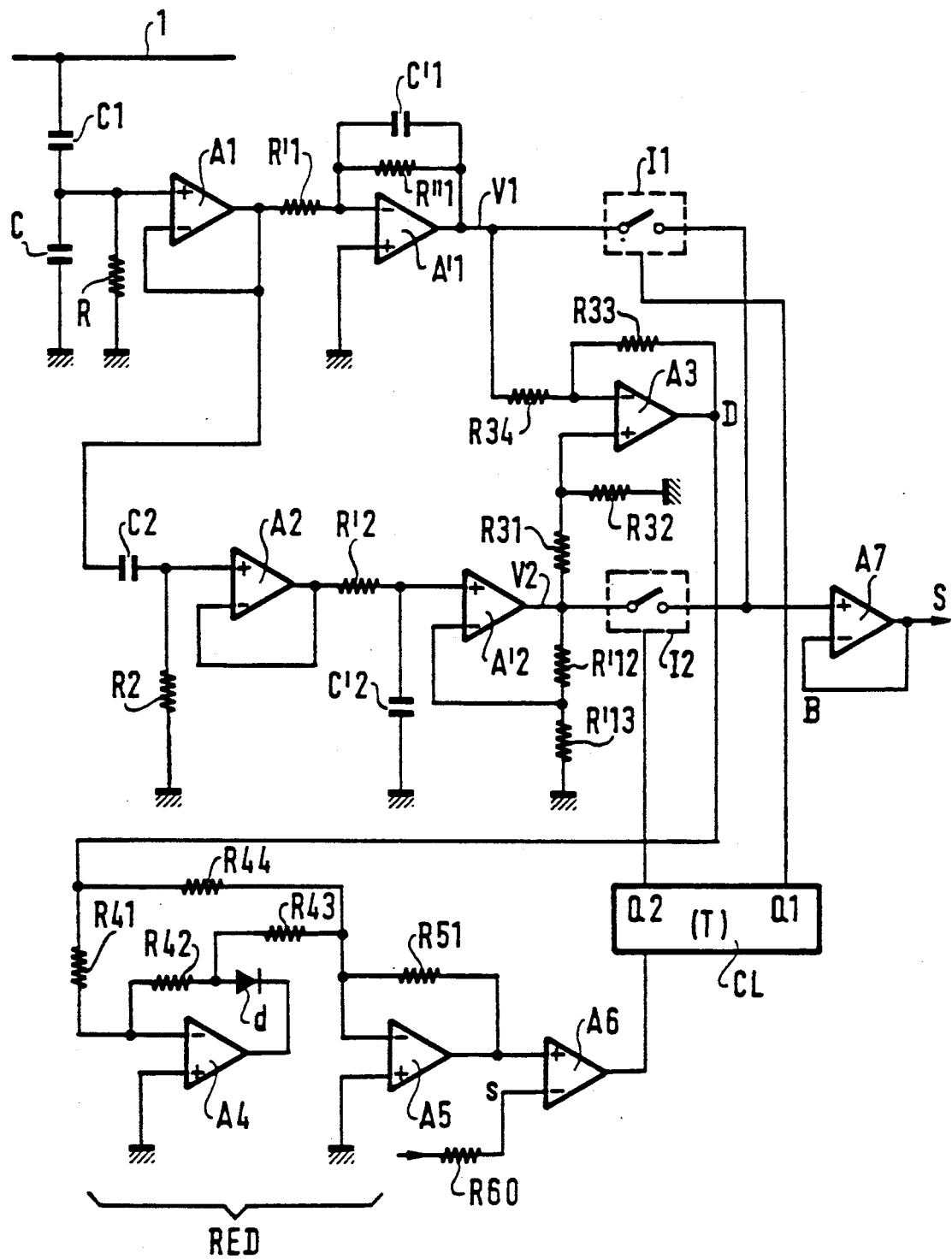

TENSION POTENTIAL MEASURING CIRCUIT WITH SELECTED TIME CONSTANT

The invention relates to a tension measuring circuit, for use in measurement and protection equipment for electricity grids.

BACKGROUND OF THE INVENTION

French utility certificate No. 78 27749 describes an electronic tension reducer followed by two amplifier circuits: one of the amplifier circuits having a relatively long time constant, of the order of 100 ms, and serving to feed the measuring units, which units are not required to have a short restoration time in the event of the tension disappearing. The other amplification circuit has a much shorter time constant, of the order of 10 ms, since it is used to feed protection units that are required to have a short restoration time. Such an apparatus therefore has two measurement systems, and an object of the present invention is to provide a circuit which includes only one measurement output. Such an apparatus is clearly cheaper than the prior art.

SUMMARY OF THE INVENTION

The present invention thus provides a circuit for measuring the tension of an electricity line, the circuit comprising, for each phase of the line: a capacitive tension divider comprising a first capacitor connected to the line and in series with a second capacitor connected to ground; and first and second amplification lines for amplifying the tension across the terminal of the second capacitor, said first amplification line having a time constant of the order of 100 ms and being associated with a phase correcting circuit, said second amplification line having a time constant of 2.5 ms to 15 ms; wherein the first and second amplification lines are connected to a common output via respective first and second switches controllable by a logic circuit, the tension measuring circuit further including a circuit for generating a signal representative of the absolute value of the algebraic difference between the respective signals provided by the first and second amplification lines, a comparator circuit receiving said signal and providing at its output a control signal for said logic circuit causing it to operate when said absolute value exceeds a given threshold, said logic circuit being connected to keep the first switch closed and the second switch open so long as said absolute value is less than said threshold, and to open the first switch and to close the second switch when said absolute value exceeds the threshold.

Advantageously, the logic circuit has a time delay.

The time delay of the logic circuit is of the order of 50 ms.

BRIEF DESCRIPTION OF THE DRAWING

An embodiment of the invention is described by way of example with reference to the accompanying drawing, in which the sole figure is a circuit diagram for one phase only of the circuit of the invention.

DETAILED DESCRIPTION

In the FIGURE, reference 1 designates one of the phases of a high tension electricity line, which phase has a capacitive tension divider connected thereto comprising a first capacitor C1 connected in series with a second capacitor C which is connected in turn to ground.

The electronic circuit comprises an operational amplifier A1 whose input circuit includes a resistor R. The resistance of R is selected so that the time constant of the circuit RC is relatively long, of the order of 100 ms. The output from amplifier A1 is connected to two lines: a first line includes an amplifier A'1 and a first switch I1, while a second line includes an amplifier A2, an amplifier A'2, and a second switch I2. The two lines are reconnected at the input to an output amplifier A7 whose output S feeds the measurement apparatuses and the line protection units.

The amplifier A'1 is connected to the output of the amplifier A1 via a resistor R'1, and it has a feedback connection comprising a capacitor C'1 and a resistor R"1 in parallel. The amplifier A'1 and its associated components constitute a phase corrector suitable, for example, for obtaining an accuracy of class 0.5 (a phase shift of not more than 20 minutes of angle between 48 Hz and 51 Hz). The values of R'1, R"1, and C'1 are selected to give the operational amplifier A'1 a long time constant, of the order of 0.1 seconds, such that the long time constant of the first line is determined by the long time constant of amplifier A1. This long time constant with its associated phase correction serves to obtain a measurement signal which is entirely suitable for feeding to line tension measuring apparatuses. The switch I1 is a controllable semiconductor switch or a relay.

The amplifier A2 is fed by an input circuit including a capacitor C2 and a resistor R2 whose values are chosen so that the second line has a time constant which is much shorter than that of the first line, lying in the range 2.5 ms to 15 ms, for example. For example, a value of 10 ms may be selected when the range of frequency variation on the line is 48 Hz to 51 Hz. This short time constant is required for controlling line protection units. The circuit has a resistor R'2 and a capacitor C'2 for providing phase correction. The amplifier A'2 associated with resistors R'12 and R'13 is a power amplifier. Like the switch I1, the switch I2 is a controllable semiconductor switch or a relay.

The respective outputs of amplifiers A'1 and A'2 are connected to two inputs of an operational amplifier A3, via respective resistors R34 and R31. Amplifier A3 is connected as a subtractor by means of two resistors R32 and R33 and serves to provide the algebraic difference $D = V1 - V2$ between the signals output by the amplifiers A'1 and A'2.

The signal D is applied to a fullwave rectifier RED comprising an operational amplifier A4 connected in a circuit with resistors R41 to R44 and a diode d, and an operational amplifier A5 connected in a circuit with a resistor R51. The rectifier circuit RED thus provides the absolute value $|V1 - V2|$ of the algebraic difference $V1 - V2$. The output from the rectifier circuit RED is connected to one of the inputs of a comparator A6 whose other input receives a threshold signal s via a resistor R60. The output from the comparator A6 is connected to a logic circuit CL having two complementary outputs Q1 and Q2 which control the switches I1 and I2 respectively. The logic circuit is organized so that if the comparator A6 delivers a zero signal ($|V1 - V2| < s$), then its output Q1 is active and switch I1 is closed. Otherwise, if the comparator detects that the difference between V1 and V2 is greater than the threshold value S, output Q2 is activated, switch I1 opens and switch I2 closes. The logic circuit CL is fitted with a time delay, e.g. of 50 ms, whose function is explained below.

The circuit operates as follows:

Under normal steady state conditions, the signals V1 and V2 are equal so the comparator A6 provides a zero output signal. The output Q1 of the circuit CL is thus active by construction so that the line A1, A'1 is in operation, thereby enabling measurements to be taken with the necessary accuracy.

In the event of re-engaging on a loaded line, the output voltages V1 and V2 will include a so-called DC component that decays exponentially, in 100 ms for V1 and in 10 ms for V2. The signals V1 and V2 will therefore be different, and as soon as the difference between them reaches the threshold value, the logic circuit CL switches over, thereby opening switch I1 and closing switch I2. The second amplification line is therefore put into operation with its short time constant which eliminates the unwanted exponential component very quickly, which component would otherwise saturate the transformer of the power amplifier following the preamplifier.

The time delay before switching back again prevents repeated switchovers occurring when the difference V1−V2 comes close to the threshold s.

This threshold must be greater than the calibration error that may occur between the two signals V1 and V2 (at 50 Hz) plus the frequency drift error at the two limits of the frequency band (48 Hz, 51 Hz).

The circuit of the invention has the advantage of being simpler than the prior art circuit. Under normal conditions the measurement phase error is small.

When re-engaging on a loaded line, the DC component is eliminated quickly.

It is possible to adjust both the value of the threshold s and the time delay in order to optimize operation. The first amplification line (having a time constant of about 100 ms) is ideal for transmitting transients due to a cause other than reengagement on a loaded line. If the value of the threshold s is chosen to be sufficiently high, these transients can be measured without switching over the logic circuit CL.

When the frequency excursion of the line is small (e.g. 49.5 Hz to 50.5 Hz), the best response under transient conditions with re-engagement on a loaded line is obtained by using a time constant R2C2 equal to 3.18 ms (instead of 10 ms). The time constant R'2C'2 is then also equal to 3.18 ms. (3.18 ms=$1/2\pi f_O$, where $f_O$=50 Hz.)

At 60 Hz, 3.18 ms is replaced by 2.65 ms.

The invention is applicable to operating and protecting electricity grids.

I claim:

1. A circuit for measuring the tension of an electricity line, the circuit comprising, for each phase of the line: a capacitive tension divider comprising a first capacitor connected to the line and in series with a second capacitor connected to ground; and first and second amplification lines for amplifying the tension across the terminal of the second capacitor, said first amplification line having a time constant of the order of 100 ms and being associated with a phase correcting circuit, said second amplification line having a time constant of 2.5 ms to 15 ms; wherein the first and second amplification lines are connected to a common output via respective first and second switches controllable by a logic circuit, the tension measuring circuit further including a circuit for generating a signal representative of the absolute value of the algebraic difference between the respective signals provided by the first and second amplification lines, a comparator circuit receiving said signal and providing at its output a control signal for said logic circuit causing it to operate when said absolute value exceeds a given threshold, said logic circuit being connected to keep the first switch closed and the second switch open so long as said absolute value is less than said threshold, and to open the first switch and to close the second switch when said absolute value exceeds the threshold.

2. A circuit according to claim 1, wherein when the range of frequency variation of the electricity line is 49.5 Hz to 50.5 Hz, the time constant of the second amplification line is about 3.18 ms.

3. A circuit according to claim 1, wherein when the range of frequency variation on the electricity line is 59.5 Hz to 60.5 Hz, the time constant of the second amplification line is about 2.65 ms.

4. A circuit according to claim 1, wherein the logic circuit includes a time delay.

5. A circuit according to claim 4, wherein the time delay of the logic circuit is of the order of 50 ms.

* * * * *